United States Patent
Lutchyn et al.

(10) Patent No.: US 9,040,959 B2
(45) Date of Patent: May 26, 2015

(54) MULTI-BAND TOPOLOGICAL NANOWIRES

(71) Applicant: Microsoft Corporation, Redmond, WA (US)

(72) Inventors: Roman M. Lutchyn, Santa Barbara, CA (US); Sankar DasSarma, Potomac, MD (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 13/860,246

(22) Filed: Apr. 10, 2013

(65) Prior Publication Data

US 2013/0299783 A1  Nov. 14, 2013

Related U.S. Application Data

(60) Provisional application No. 61/644,010, filed on May 8, 2012.

(51) Int. Cl.
*H01L 29/06* (2006.01)
*H01L 39/22* (2006.01)
*H01L 27/18* (2006.01)

(52) U.S. Cl.
CPC .............. *H01L 39/221* (2013.01); *H01L 27/18* (2013.01); *H01L 39/22* (2013.01)

(58) Field of Classification Search
CPC .............................. H01L 29/06; H01L 39/221
USPC ........................................................... 257/31
See application file for complete search history.

(56) References Cited

U.S. PATENT DOCUMENTS

2007/0194225 A1* 8/2007 Zorn .............................. 250/306
2012/0112168 A1* 5/2012 Bonderson et al. .............. 257/31

OTHER PUBLICATIONS

Abrikosov et al, "Contribution to the Theory of Superconducting Alloys with Paramagnetic Impurities", In Journal of Soviet Physics JETP, vol. 12, Issue 6, Jun. 1961, 11 pgs.
Akhmerov et al, "Electrically Detected Interferometry of Majorana Fermions in a Topological Insulator", Mar. 2009, In Journal of Physical Review Letters, vol. 102, Issue 21, 4 pgs.
Akhmerov et al, "Quantized Conductance at the Majorana Phase Transition in a Disordered Superconducting Wire", In Journals of Physical Review Letters, vol. 106, Issue 5, Nov. 2010, 7 pgs.
Aleshkin et al, "Exchange Enhancement of the g Factor in InAs|AlSb Heterostructures", In Semiconductors, vol. 42, Issue 7, Jul. 2008, 6 pgs.
Alexandrov et al, "Low-temperature Proximity Effect in Clean Metals with Repulsive Electron—electron Interaction", In Journals of Physical Review B, vol. 78, Issue 13, Oct. 2008, 5 pgs.

(Continued)

*Primary Examiner* — Ajay K Arora
(74) *Attorney, Agent, or Firm* — Steve Wight; Judy Yee; Micky Minhas

(57) ABSTRACT

A topological qubit wire hosts Majorana zero-energy modes and includes a superconductor, which may be an s-wave superconductor, and a quasi-1D nanowire, which may be a semi-conductor. The Majorana zero-energy modes are localized at ends of the quasi-1D nanowire, which may be sized and shaped to provide occupancy of a few transverse modes in a first direction and occupancy of a few transverse modes in a second direction. In some instances, the occupancy in the first direction may be greater than or equal to 3, and the occupancy in the second direction may be 1.

20 Claims, 4 Drawing Sheets

(56) References Cited

OTHER PUBLICATIONS

Alicea et al, "Non-Abelian Statistics and Topological Quantum Information Processing in 1D Wire Networks", In Nature Physics, Sep. 2010, 23 pgs.
Alicea, "Majorana Fermions in a Tunable Semiconductor Device", In Physical Review B, vol. 81, Issue 12, Dec. 2009, 10 pgs.
Beenakker et al, "Random-matrix Theory of Andreev Reflection from a Topological Superconductor", In Journal of Physical Review B, vol. 83, Issue 8, Feb. 2011, 13 pgs.
Beenakker, "Search for Majorana fermions in superconductors", Apr. 2012, 15 pgs.
Berthod et al, "Tunneling Conductance and Local Density of States in Tight-Binding Junctions", Oct. 2011, In Journal of Physical Review B, 4 pgs.
Bolech et al, "Observing Majorana Bound States in p-wave Superconductors using Noise Measurements in Tunneling Experiments", Jun. 2007, In Journal of Physical Review Letters, vol. 98, Issue 23, 4 pgs.
Bonderson et al, "Detecting Non-Abelian Statistics in the $v=5|2$ Fractional Quantum Hall State", In Physical Review Letters, vol. 96, Issue 1, Feb. 2006, 5 pgs.
Bonderson et al, "Implementing Arbitrary Phase Gates with Ising Anyons", In Physical Review Letter, vol. 104, Issue 18, Apr. 2010, 5 pgs.
Bonderson et al, "Topological Quantum Buses: Coherent Quantum Information Transfer between Topological and Conventional Qubits", In Physical Review Letter, vol. 106, Issue 13, Mar. 2011, 5 pgs.
Bravyi, "Universal Quantum Computation with the $v=5|2$ Fractional Quantum Hall State", In Physical Review A, vol. 73, Issue 4, Apr. 2006, 16 pgs.
Brouwer et al, "Probability Distribution of Majorana End-State Energies in Disordered Wires", In Physical Review Letter, Apr. 2011, 4 pgs.
Brouwer et al, "Topological Superconducting Phases in Disordered Quantum Wires with Strong Spin-Orbit Coupling", In Journal of Physical Review B, Issue 84, Feb. 2012, 6 pgs.
Chrestin et al, "Evidence for a Proximity-induced Energy Gap in Nb|InAs|Nb Junctions", In Journals of Physical Review B, vols. 55, Issue 13, Apr. 1997, 9 pgs.
Clarke et al, "Majorana Fermion Exchange in Quasi-One-Dimensional Networks", Jan. 2011, 8 pgs.
Das Sarma et al, "Proposal to Stabilize and Detect Half-Quantum Vortices in Strontium Ruthenate Thin Films: Non-Abelian Braiding Statistics of Vortices in a px+ipy Superconductor", In Physical Review B, vol. 73, Issue 22, Oct. 2005, 5 pgs.
Das Sarma et al, "Screening and Elementary Excitations in Narrow-Channel Semiconductor Microstructures", In Journal of Physical Review B, vol. 32, Issue 2, Jul. 1985, 4 pgs.
Das Sarma et al, "Topologically Protected Qubits from a Possible Non-Abelian Fractional Quantum Hall State", In Physical Review Letters, vol. 94, Issue 16, Dec. 2004, 5 pgs.
de Gennes, "Boundary Effects in Superconductors", In Journals of Reviews of Modern Physics, Jan. 1964, 13 pgs.
Doh et al, "Tunable Supercurrent through Semiconductor Nanowires", In Science, vol. 309, Issue 5732, Jul. 2005, 12 pgs.
Efetov et al, "Multiband Transport in Bilayer Graphene at High Carrier Densities", Phys. Rev. B 84, 161412, May 2011, 5 pgs.
Flensberg, "Non-Abelian Operations on Majorana Fermions via Single Charge Control", In Physical Review Letters, vol. 106, Issue 9, Nov. 2010, 4 pgs.
Franz, "Viewpoint: Race for Majorana Fermions", In Physics, vol. 3, Issue 24, Mar. 2010, 3 pgs.
Fu et al, "Josephson Current and Noise at a Superconductor-Quantum-Spin Hall Insulator-Superconductor Junction", In Physical Review B, vol. 79, Issue 16, Apr. 2008, 4 pgs.
Fu et al, "Probing Neutral Majorana Fermion Edge Modes with Charge Transport", Mar. 2009, In Journal of Physical Review Letters, vol. 102, Issue 21, 4 pgs.
Fu et al, "Superconducting Proximity Effect and Majorana Fermions at the Surface of a Topological Insulator", In Physical Review Letters, vol. 100, Issue 9, Apr. 2008, 4 pgs.
Fujimoto, "Topological Order and Non-Abelian Statistics in Noncentrosymmetric s-Wave Superconductors", Mar. 2008, 4 pgs.
Gangadharaiah et al, "Majorana Edge States in Interacting One-Dimensional Systems", In Journals of Physical Review Letters, vol. 107, Issue 3, Dec. 2010, 5 pgs.
Chosh et al, "Non-Abelian Topological Order in Non-centrosymmetric Superconductors with Broken Time-reversal Symmetry", In Journal of Physical Review B, vol. 82, Issue 18, Jul. 2010, 10 pgs.
Gibertini et al, "Local density of states in metal topological superconductor hybrid systems", Phys. Rev. B 85, 144525, Apr. 2012, 11 pgs.
Gruzberg et al, "Localization in Disordered Superconducting Wires with Broken Spin-Rotation Symmetry", In Journal of Physical Review B, vol. 71, Issue 24, Dec. 2004, 29 pgs.
Hassler et al, "Anyonic Interferometry without Anyons: How a Flux Qubit Can Read Out a Topological Qubit", In New Journal of Physics 12, Dec. 2010, 13 pgs.
Hassler et al, "The Top-Transmon: A Hybrid Superconducting Qubit for Parity-Protected Quantum Computation", In Journal of Physics, vol. 13, Sep. 2011, 14 pgs.
Ivanov, "Non-Abelian Statistics of Half-Quantum Vortices in p-Wave Superconductors", In Physical Review Letters, vol. 86, Issue 2, May 2000, 5 pgs.
Jiang et al, "Interface between Topological and Superconducting Qubits", In Physical Review Letters, vol. 106, Issue 13, Mar. 2011, 4 pgs.
Kitaev, "Fault-tolerant Quantum Computation by Anyons", In Annals of Physics, vol. 303, Issue 1, Jan. 2003, 29 pgs.
Kitaev, "Unpaired Majorana Fermions in Quantum Wires", In Physics—Uspekhi, vol. 44, Oct. 2001, 7 pgs.
Kwon et al, "Fractional ac Josephson effect in p- and d-wave superconductors", Apr. 2004, In the European Physical Journal B—Condensed Matter and Complex Systems, vol. 37, Issue 3, 13 pgs.
Law et al, "Majorana Fermion Induced Resonant Andreev Reflection", Jul. 2009, In Journal of Physical Review Letters, vol. 103, Issue 23, 4 pgs.
Lee, "Proposal for Creating a Spin-polarized px+ipy State and Majorana Fermions", Jul. 2009, 2 pgs.
Levi, "The Expanding Search for Majorana Particles". Physics Today, Mar. 2011, 1 pgs.
Linder et al, "Unconventional Superconductivity on a Topological Insulator", In Physical Review Letters, vol. 104, Issue 6, Feb. 2010, 4 pgs.
Luisier, "Full-band quantum transport in nanowire transistors", In Journal of Computational Electronics, vol. 7, Issue 3, Jan. 2008, 6 pgs.
Lutchyn et al, "Interacting Topological Phases in Multiband Nanowires", In Journals of Physical Review B, vols. 84, Issue 21, Dec. 2011, 7 pgs.
Lutchyn et al, "Majorana Fermions and a Topological Phase Transition in Semiconductor-Superconductor Heterostructures", In Physical Review Letters, vol. 105, Issue 7, Aug. 2010, 5 pgs.
Lutchyn et al, "Search for Majorana Fermions in Multiband Semiconducting Nanowires", In Physical Review Letters, vol. 106, Issue 12, Feb. 2011, 4 pgs.
Majorana, "Teoria Simmetrica Dell elettrone E Del Positrone", In Nuovo Cimento, vol. 14, Issue 4, Apr. 1937, 14 pgs.
Mao et al, "Hole-Doped Semiconductor Nanowire on Top of an s-Wave Superconductor: A New and Experimentally Accessible System for Majorana Fermions", In Physical Review Letters, vol. 108, Issue 17, Apr. 2012, 5 pgs.
McMillan, "Tunneling Model of the Superconducting Proximity Effect", In Journals of Physical Review, vol. 175, Issue 2, Nov. 1968, 6 pgs.
Motrunich et al, "Griffiths Effects and Quantum Critical Points in Dirty Superconductors Without Spin-Rotation Invariance: One-Dimensional Examples", In Journal of Physical Review B, vol. 63, Issue 22, May 2001, 13 pgs.

(56) References Cited

OTHER PUBLICATIONS

Mourik et al, "Signatures of Majorana fermions in hybrid superconductor-semiconductor nanowire devices", Science Journal, vol. 336 No. 6084, Apr. 2012, 28 pgs.
Nadj-Perge et al, "Spin-orbit Qubit in a Semiconductor Nanowire", In Nature—International Weekly Journal of Science, vol. 468, Dec. 2010, 11 pgs.
Nayak et al, "2n Quasihole States Realize 2n-1Dimensional Spinor Braiding Statistics in Paired Quantum Hall States", In Nuclear Physics B, vol. 479, Issue 3, May 1996, 38 pgs.
Nayak, "Exotic Matter: Another Dimension for Anyons", In Nature—International Weekly Journal of Science, vol. 464, Apr. 2010, 2 pgs.
Nayak et al, "Non-Abelian Anyons and Topological Quantum Computation", In Reviews of Modern Physics, vol. 80, Issue 3, Sep. 2008, 73 pgs.
Nilsson et al, "Giant, Level-Dependent g Factors in InSb Nanowire Quantum Dots", In Nano Letters, vol. 9, Issue 9, Aug. 2009, 6 pgs.
Nilsson et al, "Splitting of a Cooper Pair by a Pair of Majorana Bound States", Aug. 2008, In Journal of Physical Review Letters, vol. 101, Issue 12, 4 pgs.
Oreg et al, "Helical Liquids and Majorana Bound States in Quantum Wires", In Physical Review Letters, vol. 105, Issue 17, Jun. 2010, 5 pgs.
Potter et al, "Erratum: Engineering a p+ip Superconductor: Comparison of Topological Insulator and Rashba Spin-orbit-coupled Materials", In Journal of Physical Review B, vol. 84, Issue 5, Aug. 2011, 2 pgs.
Potter et al, "Majorana End-States in Multi-band Microstructures with Rashba Spin-Orbit Coupling", In Physical Review, vol. 83, Issue 9, Nov. 2010, 9 pgs.
Potter et al, "Multichannel Generalization of Kitaev's Majorana End States and a Practical Route to Realize Them in Thin Films", In Physical Review Letters, vol. 105, Issue 22, Nov. 2010, 5 pgs.
Potter et al, "Topological Superconductivity and Majorana Fermions in Metallic Surface-States", Phys. Rev. B 85, 094516, Jan. 2012, 9 pgs.
Qi et al, "Chiral Topological Superconductor from the Quantum Hall State", In Physical Review, vol. 82, Issue 18, Mar. 2010, 5 pgs.
Read et al, "Paired States of Fermions in Two Dimensions with Breaking of Parity and Time-Reversal Symmetries and the Fractional Quantum Hall Effect", In Journal of Physical Review B, vol. 61, Issue 15, Jan. 2000, 35 pgs.
Sato et al, "Non-Abelian Topological Order in s-Wave Superfluids of Ultracold Fermionic Atoms", Jun. 2009, In Physical Review Letters, vol. 103, Issue 2, 5 pgs.
Sau et al, "A Generic New Platform for Topological Quantum Computation Using Semiconductor Heterostructures", In Physical Review Letters, vol. 104, Issue 4, Jan. 2010, 4 pgs.
Sau et al, "Non-abelian Quantum Order in Spin-Orbit-coupled Semiconductors: The Search for Topological Majorana Particles in Solid State Systems", In Physical Review Letters, vol. 82, Issue 21, Jun. 2010, 59 pgs.
Sau et al, "Probing Non-Abelian Statistics with Majorana Fermion Interferometry in Spin-Orbit-Coupled Semiconductors", Aug. 2011, In Journal of Physical Review B , vol. 84, Issue 8, 8 pgs.
Sau et al, "Universal Quantum Computation in a Semiconductor Quantum Wire Network", In Physical Review A, vol. 82, Issue 5, Nov. 2010, 7 pgs.
Sela et al, "Majorana Fermions in Strongly Interacting Helical Liquids", In Journals of Physical Review B, vol. 84, Issue 8, Aug. 2011, 7 pgs.
Serra, "Majorana modes and complex band structure of quantum wires", Oct. 2012, 8 pgs.
Service, "Search for Majorana Fermions Nearing Success at Last?", In Science, vol. 332, Apr. 2011, 3 pgs.
Silaev et al, "Topological Superfluid 3He-B: Fermion Zero Modes on Interfaces and in the Vortex Core", Dec. 2010, In Journal of Low Temperature Physics, vol. 161, Issue 5-6, 14 pgs.
Stanescu et al, "Proximity Effect at the Superconductor-Topological Insulator Interface", In Journal of Physical Review B, vol. 81, Issue 24, Jun. 2010, 5 pgs.
Stern et al, "Geometric Phases and Quantum Entanglement as Building Blocks for Non-Abelian Quasiparticle Statistics", In Journal of Physical Review B, vol. 70, Issue 20, Oct. 2003, 17 pgs.
Stern, "Non-Abelian States of Matter", In Nature—International Weekly Journal of Science, vol. 464, Mar. 2010, 7 pgs.
Stern et al, "Proposed Experiments to Probe the Non-Abelian $v=5|2$ Quantum Hall State", In Physical Review Letters, vol. 96, Issue 1, Sep. 2005, 5 pgs.
Stoudenmire et al, "Interaction Effects in Topological Superconducting Wires Supporting Majorana Fermions", In Journal of Physical Review B, vol. 84, Issue 1, Apr. 2011, 14 pgs.
Takayanagi et al, "Superconducting Proximity Effect in the Native Inversion Layer on InAs", Jun. 1985, In Physical Review Letters, vol. 54, Issue 22, 4 pgs.
Tewari et al, "Quantum Computation using Vortices and Majorana Zero Modes of a px+ipy Superfluid of Fermionic Cold Atoms", Jun. 2006, In Physical Review Letters, vol. 98, Issue 1, 5 pgs.
Tewari et al, "Testable Signatures of Quantum Non-Locality in a Two-Dimensional Chiral p-Wave Superconductor", Jan. 2008, In Journal of Physical Review Letters, vol. 100, Issue 2, 4 pgs.
Tewari et al, "Testable Signatures of Quantum Nonlocality in a Two-Dimensional Chiral p-Wave Superconductor", In Physical Review Letters, vol. 100, Issue 2, Dec. 2007, 4 pgs.
Tewari et al, "Topologically Non-trivial Superconductivity in Spin-orbit-coupled Systems: Bulk Phases and Quantum Phase Transitions", In New Journal of Physics, vol. 13, Jun. 2011, 21 pgs.
Thomas et al, "Current-voltage Characteristics of Semiconductor-coupled Superconducting Weak Links with Large Electrode Separations", Nov. 1998, In Physical Review B, vol. 58, No. 17, 9 pgs.
Van Dam et al, "Supercurrent Reversal in Quantum Dots", In Nature—International Weekly Journal of Science, Aug. 2006, 19 pgs.
Wilczek, "Majorana Returns", In Nature Physics, vol. 5, Sep. 2009, 5 pgs.
Wimmer et al, "Majorana Bound States without Vortices in Topological Superconductors with Electrostatic Defects", In Journals, Physical Review Letter, vol. 105, Issue 4, Sep. 2011, 8 pgs.
Wimmer et al, "Quantum Point Contact as a Probe of a Topological Superconductor", May 2011, In New Journal of Physics, vol. 13, 11 pgs.
Yamashiro et al, "Theory of Tunneling Spectroscopy in Superconducting Sr2RuO4", In Journal of Physical Review B, vol. 56, Issue 13, Oct. 1997, 7 pgs.
Zhang et al, "px+ipy Superfluid from s-Wave Interactions of Fermionic Cold Atoms", Oct. 2008, In Physical Review Letters, vol. 101, Issue 16, 4 pgs.
Zilberberg et al, "Controlled-NOT Gate for Multiparticle Qubits and Topological Quantum Computation Based on Parity Measurements", In Physical Review A, vol. 77, Issue 1, Jan. 2008, 8 pgs.
Stanescu et al, "Majorana Fermions in Semiconductor Nanowires", Physical Review B 84, Oct. 2011, 29 pgs.

\* cited by examiner

MULTI-BAND TOPOLOGICAL NANOWIRES

CROSS-REFERENCE TO RELATED APPLICATIONS

This application claims benefit, under 35 U.S.C. §119(e), of U.S. Provisional Patent Application No. 61/644,010, filed May 8, 2012, which is incorporated herein, by reference, in its entirety.

BACKGROUND

Majorana fermions, particles which are their own antiparticles, were originally envisioned by E. Majorana in 1937 in the context of particle physics (i.e., the physics of neutrinos). However, the current search for Majorana modes (Majoranas) is mostly taking place in condensed matter systems where Majorana quasi-particles appear in electronic systems as a result of fractionalization, and as emergent modes occupying non-local zero energy states. The non-locality of these modes provides the ability to exchange and manipulate fractionalized quasiparticles and leads to non-Abelian braiding statistics. Hence, in addition to being of paramount importance for fundamental physics, this property of the Majoranas places them at the heart of topological quantum computing schemes.

Majorana zero-energy modes/quasiparticles can appear quite naturally in 2D chiral p-wave superconductors where these quasiparticles, localized at the vortex cores, correspond to an equal superposition of a particle and a hole. A very simple model for Majorana zero-energy modes/quasiparticles is a one-dimensional (1D) Majorana quantum wire with localized Majorana zero-energy modes/quasiparticles at the ends. Both of the above cases involve spinless p-wave superconductors where the existence of Majorana zero-energy modes can be explicitly demonstrated by solving the corresponding mean field Bardeen-Cooper-Schrieffer (BCS) Hamiltonian. Recently, a way to engineer spinless p-wave superconductors has been suggested using a combination of strong spin-orbit coupling and superconducting proximity effect, thus opening the possibility of realizing Majorana quasiparticles in solid-state systems.

SUMMARY

This disclosure describes a new topological qubit-wire based on semiconductor/superconductor heterostructure. Majorana zero-mode modes, localized at opposite ends of the topological qubit-wire constitute a non-local quantum two level system (quantum bit or qubit), and can be used to encode information. The topological qubit wire includes a superconductor, which may be an s-wave superconductor, and a quasi-1D nanowire, which may be a semi-conductor.

The quasi-1D nanowire may be sized and shaped to provide occupancy of one or more transverse modes in a first direction and occupancy of one or more transverse modes in a second direction. If the number of modes (or conduction channels) is one in both transverse directions, a nanowire is regarded as strictly one-dimensional. However if the number of channels is larger than 1 but smaller than 10, a nanowire may be regarded as quasi-one-dimensional (quasi-1D). Physical properties of 1D and quasi-1D nanowires may differ substantially. For the purposes of this disclosure, the quasi 1D nanowire discussed herein provides between 2 through 10 transverse modes (or channels). In some instances, the occupancy in the first direction may be greater than or equal to 3, and the occupancy in the second direction may be 1.

The topological qubit-wire may include an insulative layer between the superconductor and the quasi-1D nanowire. A quantum tunneling transmission coefficient for electrons tunneling between the superconductor and the quasi-1D nanowire is controlled by a thickness of the insulative layer. The quantum tunneling transmission coefficient may be non-uniform.

In some embodiments, the quantum tunneling transmission coefficient may vary in one direction while remaining constant, or approximately constant, in a second direction.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Overview

This disclosure describes a topological qubit-wire that provides topological qubits. The topological qubits involve non-local Majorana modes, and the structure may include a quasi-1D semiconductor nanowire and an s-wave superconductor. The quasi-1D semiconductor nanowire has a strong spin-orbit interaction and is in close contact with the s-wave superconductor. In the superconductor-semiconductor heterostructure, the Majorana mode may exist as a zero-energy state.

For additional details of Majorana quasi-particles and semiconductor nanowires see: Lutchyn, Stanescu, Das Sarma, "Majorana fermions in multiband semiconducting nanowires," Physical Review Letters 106, 127001 (2011), and Stanescu, Lutchyn, Das Sarma, "Majorana Fermions in Semiconductor Nanowires," Physical Review B 84, 144522 (2011).

Illustrative Topological Qubit Array

Figure 1:
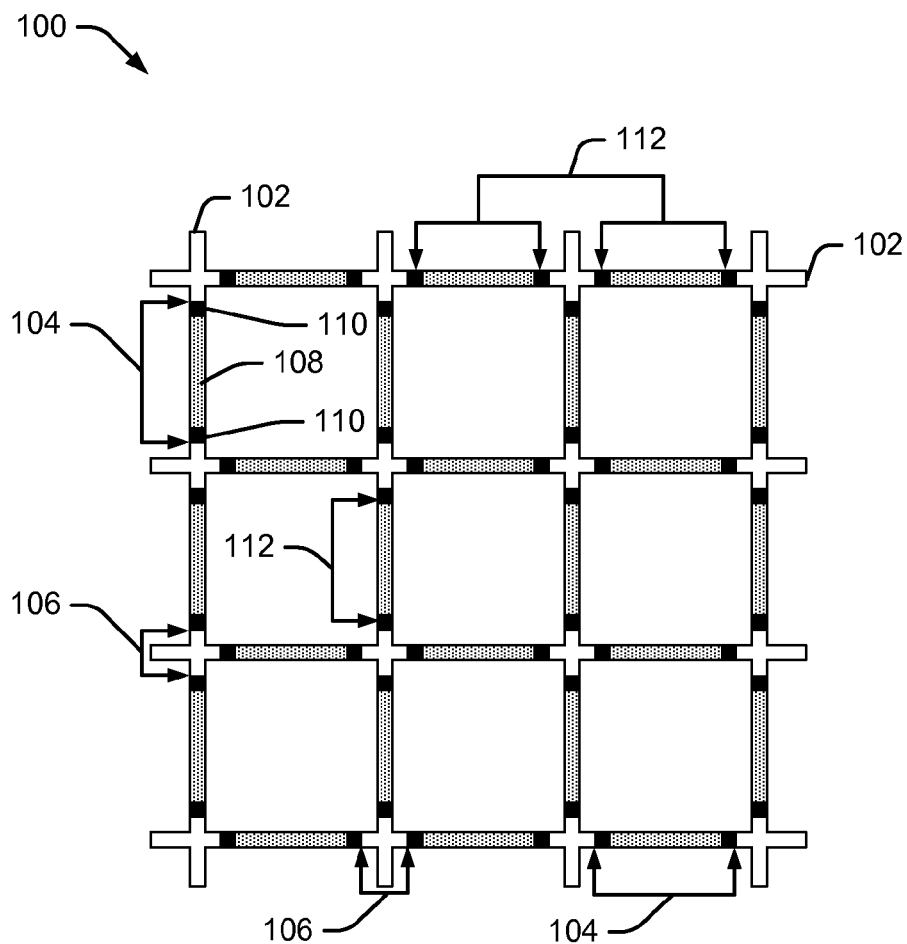
FIG. 1 is a schematic diagram of an example topological qubit array.

FIG. 1 is a schematic diagram of an example topological qubit array 100. The topological qubit array 100 includes an array of topological qubit-wires 102.

A topological qubit-wire 102 includes one or more topological phase segments 104, which are also referred to as Majorana segments, and non-topological phase segments 106. For the purposes of this disclosure a topological phase segment is defined as being in a topological superconducting phase with localized, unpaired zero-energy or low-energy Majorana modes localized at opposite ends of the segment. The non-topological phase segments 106 do not have localized Majorana modes but can be induced to change into Majorana segments 104 and vice-versa. For example, an electric potential may be applied to a portion of a non-topological phase segment 106 to change the chemical potential in the portion of the non-topological phase segment 106, and the change in the chemical potential may then cause the portion to enter the topological superconducting phase of a Majorana segment.

Each Majorana segment 104 has length of Majorana wire 108 with unpaired non-abelian anyons 110 localized at opposite ends of the Majorana wire 108. The non-abelian anyons 110 are Majorana quasi-particles.

A topological qubit 112 may be comprised of two or more non-abelian anyons 110. Calculations may be performed by placing the topological qubits 112 in an initial state, evolving the topological qubits 112 such as by braiding world-lines of two or more of the non-abelian anyons 110, and determining a final state of the topological qubits 112.

Illustrative Examples of Topological Qubit-Wire

Figure 2:
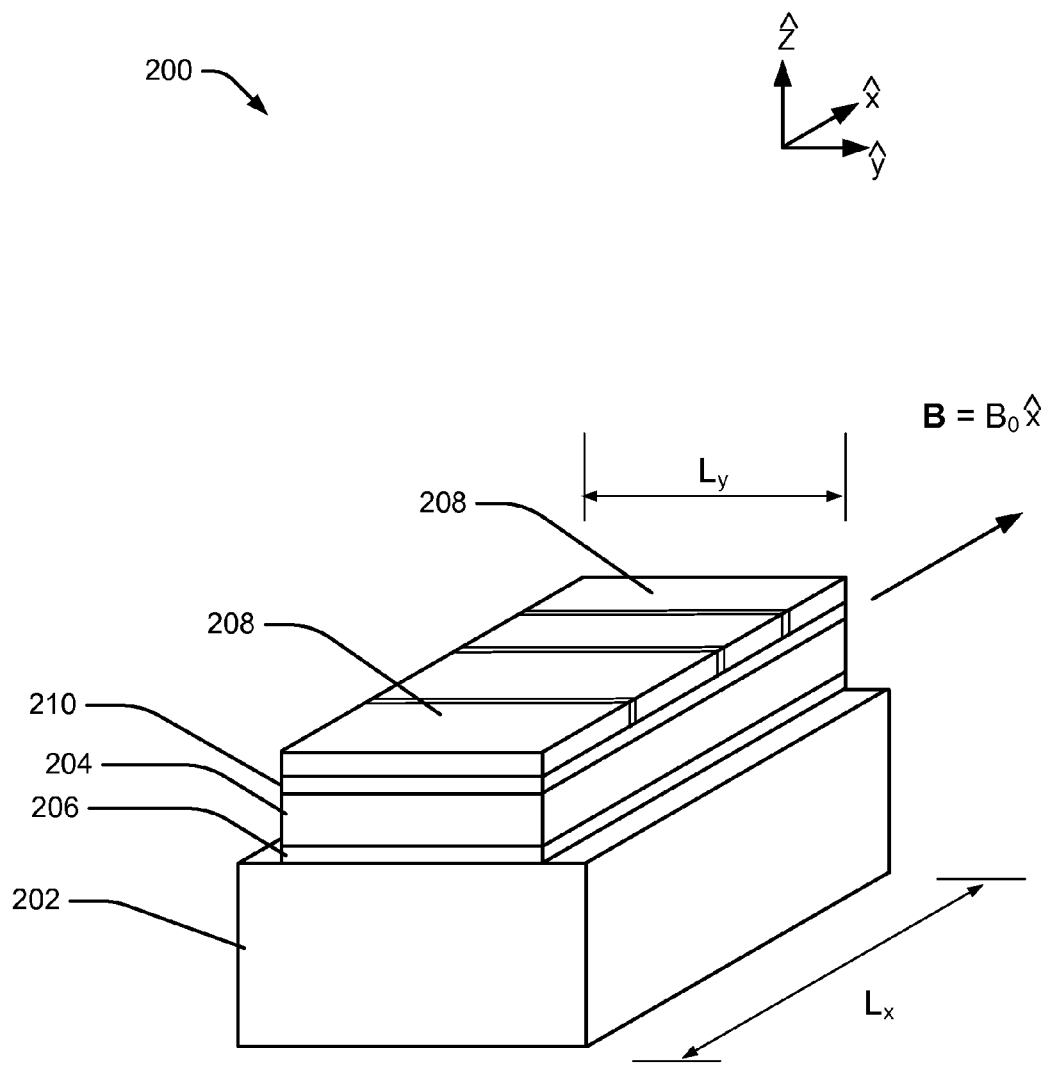
FIG. 2 is an isometric schematic view of an example topological qubit-wire that may be employed in the topological qubit array.

FIG. 2 shows an isometric schematic view of a topological qubit-wire 200 that may be implemented in the topological qubit array 100.

The topological qubit-wire 200 includes a superconductor 202 and a multi-band nanowire 204. The superconductor 202 may be an s-wave superconductor such as aluminum (Al) or niobium (Nb).

The multi-band nanowire 204 is a quasi-1D semiconductor wire having a length ($L_x$), a width ($L_y$) and a thickness ($L_z$), where the width is larger than the thickness and the length is larger than the width. For example, the width may be in the range of 50-200 nanometers (nm), the thickness may be in the range of 1-10 nm, and the length may be in the order of microns (μm). In one embodiment, the length may be between 5-10 μm, the width may be approximately 130 nm, and the thickness may be approximately 5 nm.

The multi-band nanowire 204 is a quasi-1D semiconductor wire because the multi-band nanowire 204 is strongly confined in the z-direction, by its thickness (i.e., the thinness of its thickness), so that only the lowest sub-band is occupied, while the weaker confinement in the y-direction, by its width, provides a few occupied sub-bands.

The multi-band nanowire 204 may be a semiconductor such as indium antimonide (InSb) or Indium arsenide (InAs) and may be epitaxially grown. The multi-band nanowire 204 may have a large spin-orbit interaction strength α and may have a large Lande g-factor (e.g., $g_{InAs}$:10-25 and $g_{InSb}$:20-70). Furthermore, the multi-band nanowire 204 may be of a material (e.g., InSb or InAs) that forms interfaces that are highly transparent for electrons, thereby allowing one to induce a large superconducting gap Δ via the proximity effect.

The superconductor-semiconductor heterostructure of the topological qubit-wire 200 under proper conditions hosts Majorana modes at zero (or close to zero) energies. The heterostructure consists of the multi-band nanowire 204 having a strong Rashba coupling and the superconductor 202. The spin-orbit coupling can be characterized a vector (e.g. the spin-orbit vector may point along y-axis). An in-plane magnetic field applied perpendicular to the spin-orbit vector (e.g. $\vec{B}=B_0\hat{x}$,) may drive the system into a topological phase.

An insulative layer 206, such as, but not limited to, an aluminum oxide layer, may interpose the superconductor 202 and the multi-band nanowire 204. Quantum tunneling of electrons, between the superconductor 202 and the multi-band nanowire 204, occurs through the insulative layer 206, and features of the insulative layer 206 may be used to regulate the quantum tunneling of the electrons. For example, the thickness, as measured in the z direction, of the insulative layer 206 may be used to control the amount of quantum tunneling of the electrons.

In some embodiments, the multi-band topological qubit-wire 200 may include a top array of gates 208 positioned proximal to a surface of the multi-band nanowire 204. A second insulative layer 210 may interpose the top array of gates 208 and the multi-band nanowire 204. The array of gates 208 may selectively provide an electric field to the multi-band nanowire 204 to induce changes to the chemical potential of the multi-band nanowire 204, and thereby change portions of the multi-band nanowire 204 between topological phase (i.e., having Majorana modes) and non-topological phase (i.e., having no Majorana modes).

Figure 3:
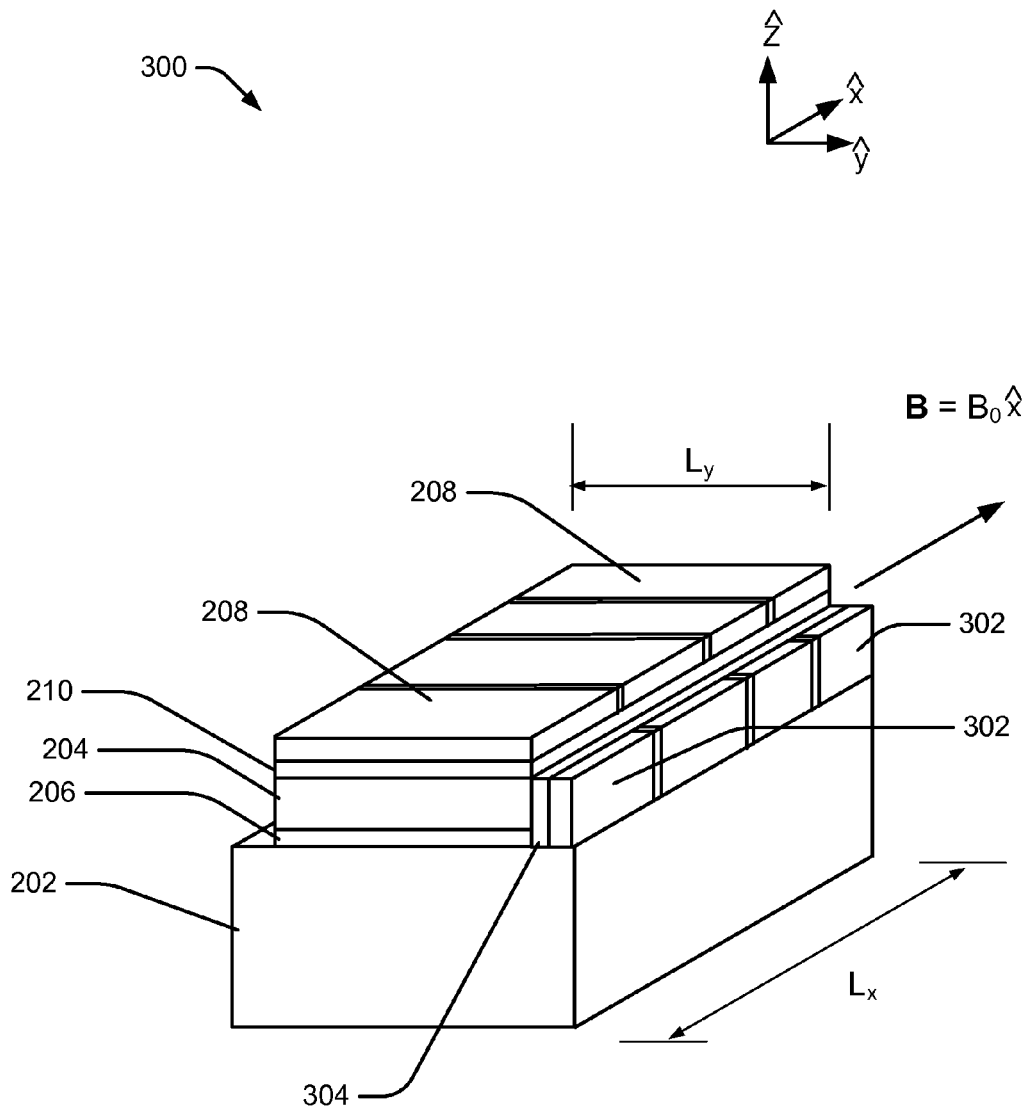
FIG. 3 is an isometric schematic view of another example topological qubit-wire that may be employed in the topological qubit array.

In the illustrated embodiment of FIG. 2, the insulative layer 210 and the top array of gates are distal from the superconductor 202, disposed on an upper surface of the multi-band nanowire 204. However, FIG. 3 shows an isometric schematic view of a topological qubit-wire 300 that may be implemented in the topological qubit array 100. The topological qubit-wire 300 is similar to the topological qubit-wire 200. Features of the topological qubit-wire 300 that have a reference numeral in the 200's (i.e., 202-208) are the same as previously described with respect to the topological qubit-wire 200. In the interest of brevity, these features are not discussed again.

The topological qubit-wire 300 also includes a side array of gates 302 and an insulative layer 304. The side array of gates 302 and the insulative layer 304 are disposed on a side surface of the multi-band nanowire 204, with the insulative layer 304 interposing the multi-band nanowire 204 and the array of gates 302. The array of gates 302 may selectively provide an electric field to the multi-band nanowire 204 to induce changes to the chemical potential of the multi-band nanowire 204, and thereby change portions of the multi-band nanowire 204 between topological phase (i.e., having Majorana modes) and non-topological phase (i.e., having no Majorana modes).

In other embodiments (not shown), a topological qubit-wire 300 may include additional, or fewer, arrays of gates. For example, such topological qubit-wires may include pairs of side arrays of gates 302 that are disposed on opposite sides of the multi-band nanowire 204. As another example, such topological qubit-wires may have one or more side arrays of gates 302, but might not include the top array of gates 208.

Figure 4:
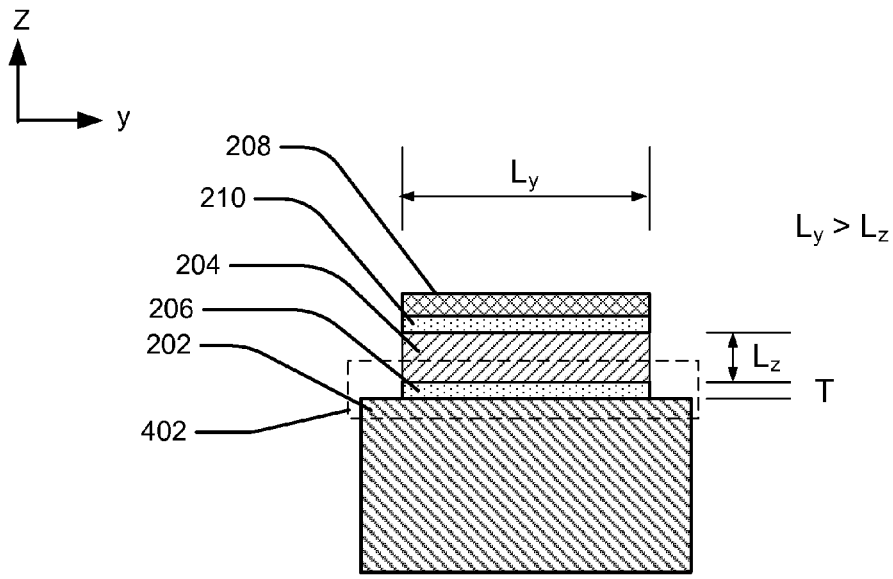
FIG. 4 is schematical cross sectional view of the example topological qubit-wire of FIG. 2.

FIG. 4 is a schematical cross sectional view of the example topological qubit-wire 200. The insulative layer 206 has a thickness, T, which may be thin, e.g., in the order of a 5-30 angstroms. The thickness, T, and/or the composition of the insulative layer 206 may be utilized to moderate quantum tunneling between the superconductor 202 and the multi-band nanowire 204. In some embodiments, the insulative layer 206 may have a thickness and/or composition so that the rate of quantum tunneling is not too strong, i.e. broadening of the energy levels in the nanowire due to tunneling into a metal (i.e. not a superconductor) is smaller than the superconducting gap.

The quantum tunneling transmission coefficient ($T_{QT}$) for electrons tunneling through the insulative layer 206 may be non-uniform. In some embodiments, the quantum tunneling transmission coefficient ($T_{QT}$) may vary in both the x-direction and the y-direction, i.e., $T_{QT}=T_{QT}(x,y)$. In some embodiments, variations of the quantum tunneling transmission coefficient ($T_{QT}$) in the x-direction may be small in comparison to variations in the y-direction.

In some embodiments, the quantum tunneling transmission coefficient ($T_{QT}$) may vary in the y-direction while remaining constant in the x-direction, i.e., $T_{QT}=T_{QT}(x,y)=T_{QT}(y)$.

In some embodiments, transverse variations (i.e., variations in the y-direction) in the quantum tunneling transmission coefficient ($T_{QT}$) for electrons tunneling through the insulative layer 206 may have a characteristic length comparable to the width, $L_y$, of the multi-band nanowire 204. In some embodiments, the characteristic length in transverse variations in the quantum tunneling transmission coefficient ($T_{QT}$) for electrons tunneling through the insulative layer 206 may range from approximately one-quarter of the width ($L_y$) to being approximately comparable to the width ($L_y$).

It should also be noted that while the quantum tunneling transmission coefficient ($T_{QT}$) for electrons tunneling through the insulative layer 206 may vary transversely (i.e., in the y-direction), the quantum tunneling transmission coefficient ($T_{QT}$) for electrons tunneling through the insulative layer 206 of the insulative layer 206 may be constant or approximately constant along the longitudinal length (i.e., in the x-direction). In some embodiments, the characteristic length of longitudinal variation of the quantum tunneling transmission coefficient ($T_{QT}$) for electrons tunneling through the insulative layer 206 may be larger than the width, $L_y$, of the multi-band nanowire 204.

Figure 5:
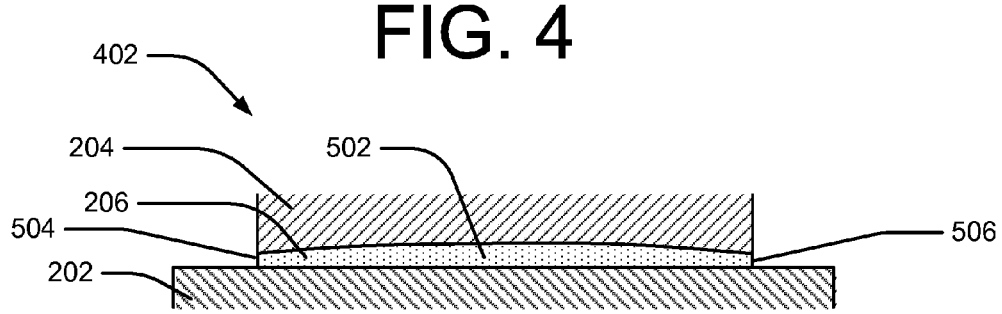
FIG. 5 is a schematical cross sectional view of the example topological qubit-wire of FIG. 2, in accordance with one non-limiting embodiment.
Figure 6:
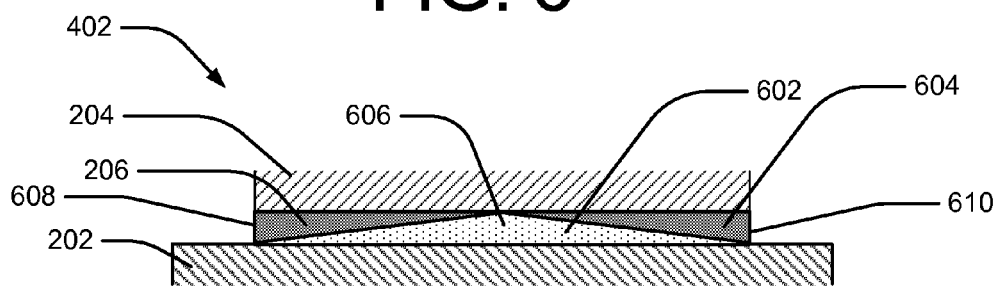
FIG. 6 is a schematical cross sectional view of the example topological qubit-wire of FIG. 2, in accordance with one non-limiting embodiment.

In some embodiments, the thickness, T, of the insulative layer 206 may be non-uniform, as illustrated in FIG. 5, and in some embodiments, the insulative layer 206 may be non-homogenous, as illustrated in FIG. 6. Box 402, which is shown in dashed line, represents a portion of the topological qubit-wire 200 illustrated in FIGS. 5 and 6.

Referring to FIG. 5, at an approximate transverse midpoint 502 of the insulative layer 206, the thickness of the insulative layer 206 is approximately at a maximum ($T_{max}$). The thickness of the insulative layer 206 decreases away from the approximate transverse midpoint 502, and at ends 504 and 506, the thickness is approximately at minimum thickness ($T_{min}$). The variation in thickness of the insulative layer 206 is one non-limiting example for providing a non-uniform quantum tunneling transmission coefficient in the insulative layer 206.

The variation of the thickness of the insulative layer 206 illustrated in FIG. 5 is one non-limiting example of a variation in thickness. As another example, the thickness of the insulative layer 206 may be greatest at one end, e.g., end 504, of the insulative layer 206. It should be noted that variations in the thickness do not need to be monotonic in the y-direction. For example, the thickness of the insulative layer 206 may be approximately the same at both ends 504 and 506, where it may be approximately the greatest.

In some embodiments, transverse variations (i.e., variations in the y-direction) in the thickness may have a characteristic length comparable to the width, $L_y$, of the multi-band nanowire 204. In some embodiments, the characteristic length in transverse variations in the thickness may range from approximately one-quarter of the width ($L_y$) to being approximately comparable to the width ($L_y$).

It should also be noted that while the thickness of the insulative layer 206 may vary transversely (i.e., in the y-direction), the thickness of the insulative layer 206 may be uniform or approximately uniform along the longitudinal length (i.e., in the x-direction). In some embodiments, the characteristic length of a longitudinal variation of thickness may be larger than the width, $L_y$, of the multi-band nanowire 204.

Referring to FIG. 6, the insulative layer 206 may be non-homogenous and may be comprised of insulative materials 602 and 604 and may have a non-uniform quantum tunneling transmission coefficient. The insulative materials 602 and 604 may provide different quantum tunneling coupling between the superconductor 202 and the multi-band nanowire 204. For example, the insulative material 602 may be more transparent to electrons than the insulative material 604 (i.e., the quantum tunneling transmission coefficient ($T_{QT}$) for electrons tunneling through the insulative material 602 may be higher than the quantum tunneling transmission coefficient ($T_{QT}$) for electrons tunneling through the insulative material 604).

Thickness, measured in the z-direction, of the insulative material 602 and the insulative material 604 may vary across (in the y-direction) the width of the multi-band nanowire 204 while the thickness of the insulative layer 206 may remain approximately uniform. For example, at an approximate transverse midpoint 606 of the insulative layer 206, the thickness of the insulative material 602 is approximately at a maximum and the thickness of the insulative material 604 is approximately at a minimum. Away from the approximate transverse midpoint 606, the thickness of the insulative material 602 decreases while the thickness of the insulative material 604 increases, and at ends 608 and 610, the thickness of the insulative material 602 is approximately at a minimum and while the thickness of the insulative material 604 is approximately at a maximum.

The variation of the thicknesses of the insulative materials 602 and 604 illustrated in FIG. 6 is one non-limiting example for providing a non-uniform quantum tunneling transmission coefficient in the insulative layer 206.

In some embodiments, transverse variations (i.e., variations in the y-direction) in the thickness of the insulative material 602 and/or the insulative material 604 may have a characteristic length comparable to the width, $L_y$, of the multi-band nanowire 204. In some embodiments, the characteristic length in transverse variations in the thickness may range from approximately one-quarter of the width ($L_y$) to being approximately comparable to the width ($L_y$).

It should also be noted that while the thicknesses of the insulative material 602 and/or the insulative material 604 may vary transversely (i.e., in the y-direction), the thickness of the insulative material 602 and/or the insulative material 604 may be approximately uniform along the longitudinal length (i.e., in the x-direction). In some embodiments, the characteristic length of a longitudinal variation of thickness may be larger than the width, $L_y$, of the multi-band nanowire 204.

Conclusion

Although the techniques have been described in language specific to structural features and/or methodological acts, it is to be understood that the appended claims are not necessarily limited to the specific features or acts described. Rather, the specific features and acts are disclosed as exemplary forms of implementing such techniques.

What is claimed is:

1. A topological qubit wire, comprising:
   a superconductor; and
   a quasi-1D multi-band nanowire coupled, via quantum tunneling, to the superconductor and having a Majorana segment that supports Majorana zero-energy modes at opposed longitudinal ends of the Majorana segment, wherein the Majorana segment has a longitudinal length extending between the opposed longitudinal ends and a transverse width, and wherein the quantum tunneling between the superconductor and the Majorana segment is non-uniform across the transverse width for at least one portion of the Majorana segment.

2. The topological qubit wire of claim 1, wherein the transverse width of the Majorana segment supports an odd number, which is at least three, of transverse subbands.

3. The topological qubit wire of claim 2, wherein the odd-number is at least 3 and at most 15.

4. The topological qubit wire of claim 1, wherein the superconductor comprises an s-wave superconductor.

5. The topological qubit wire of claim 1, wherein the quasi-1D multi-band nanowire comprises a semi-conductor.

6. The topological qubit wire of claim 1, further comprising:
an insulator interposing the superconductor and the quasi-1D multi-band nanowire.

7. The topological qubit wire of claim 1, wherein a longitudinal variation of the quantum tunneling exists and is less than a transverse variation of quantum tunneling between the superconductor and the quasi-1D multi-band nanowire.

8. The topological qubit wire of claim 7, wherein the longitudinal variation of the quantum tunneling is approximately uniform relative to the transverse variation of the quantum tunneling strength.

9. A topological qubit wire, comprising:
an s-wave superconductor;
a quasi-1D multi-band nanowire coupled, via quantum tunneling, to the s-wave superconductor and having a Majorana segment that supports Majorana zero-energy modes at opposed longitudinal ends of the Majorana segment, wherein the Majorana segment has a longitudinal length extending between the opposed longitudinal ends and a transverse width; and
a non-uniform insulative layer interposing the s-wave superconductor and the quasi-1D multi-band nanowire, wherein the non-uniform insulative layer provides, across the transverse width of the quasi-1D multi-band nanowire, a non-uniform quantum tunneling transmission coefficient between the Majorana segment and the s-wave superconductor for at least one portion of the Majorana segment.

10. The topological qubit wire of claim 9, further comprising:
a gate that provides an electric field to a portion of the quasi-1D multi-band nanowire, wherein regulation of the electric field changes the portion of the quasi-1D multi-band nanowire between being in a non-topological phase and a topological superconducting phase.

11. The topological qubit wire of claim 9, wherein the transverse width of the Majorana segment supports an odd number, which is at least three, of transverse subbands.

12. The topological qubit wire of claim 9, wherein the quasi-1D multi-band nanowire comprises a semi-conductor.

13. The topological qubit wire of claim 9, wherein a longitudinal variation of the quantum tunneling transmission coefficient exists and is less than a transverse variation of quantum tunneling transmission coefficient between the s-wave superconductor and the quasi-1D multi-band nanowire.

14. The topological qubit wire of claim 13, wherein the longitudinal variation of the quantum tunneling transmission coefficient is approximately uniform relative to the transverse variation of the quantum tunneling transmission coefficient.

15. A topological qubit wire, comprising:
an s-wave superconductor;
a quasi-1D semiconductor multi-band nanowire coupled, via quantum tunneling, to the s-wave superconductor and having a Majorana segment that supports Majorana zero-energy modes at opposed longitudinal ends of the Majorana segment, wherein the Majorana segment has a longitudinal length extending between the opposed longitudinal ends, a transverse width, and a vertical thickness, wherein the vertical thickness of the quasi-1D semiconductor multi-band nanowire limits occupancy of transverse modes in a vertical direction to one; and
a non-uniform insulative layer interposed between the s-wave superconductor and the quasi-1D semiconductor multi-band nanowire, wherein the non-uniform insulative layer provides, across the transverse width of the quasi-1D semiconductor multi-band nanowire, a non-uniform quantum tunneling transmission coefficient between the Majorana segment and the s-wave superconductor for at least one portion of the Majorana segment.

16. The topological qubit wire of claim 15, wherein the transverse width of the quasi-1D semiconductor multi-band nanowire limits occupancy of modes in the transverse width to between 1 and 15.

17. The topological qubit wire of claim 16, wherein the modes in the transverse width comprises an odd-number of transverse subbands.

18. The topological qubit wire of claim 15, wherein a longitudinal variation of the quantum tunneling transmission coefficient exists and is less than a transverse variation of quantum tunneling transmission coefficient between the superconductor and the Majorana segment.

19. The topological qubit wire of claim 15, wherein the longitudinal variation of the quantum tunneling transmission coefficient is approximately uniform relative to the transverse variation of the quantum tunneling transmission coefficient.

20. The topological qubit wire of claim 15, wherein the vertical thickness of the quasi-1D semiconductor nanowire is in the range of 1-10 nm.

* * * * *